(12) United States Patent  
Kozyrev et al.

(10) Patent No.: US 9,591,793 B2  
(45) Date of Patent: Mar. 7, 2017

(54) DEFLECTING DEVICE FOR ELECTROMAGNETIC RADIATION

(71) Applicant: Samsung Electronics Co., Ltd., Suwon-si (KR)

(72) Inventors: Andrew Borisovich Kozyrev, Saint-Petersburg (RU); Alexander Chernokalov, Moscow Region (RU); Vitally Osadchy, Leningrad Region (RU); Andrew Altynnikov, Saint-Petersburg (RU); Igor Kotelnikov, Saint-Petersburg (RU)

(73) Assignee: Samsung Electronics Co., Ltd., Suwon-si (KR)

( * ) Notice: Subject to any disclaimer, the term of this patent is extended or adjusted under 35 U.S.C. 154(b) by 694 days.

(21) Appl. No.: 13/922,341

(22) Filed: Jun. 20, 2013

(65) Prior Publication Data

US 2013/0343009 A1     Dec. 26, 2013

(30) Foreign Application Priority Data

Jun. 20, 2012  (RU) .............................. 2012125442  
Jun. 19, 2013  (KR) ...................... 10-2013-0070185

(51) Int. Cl.
  *H05K 1/03*   (2006.01)
  *H05K 9/00*   (2006.01)
  *H01Q 15/00*  (2006.01)

(52) U.S. Cl.
  CPC ............. *H05K 9/00* (2013.01); *H01Q 15/002* (2013.01); *H01Q 15/0053* (2013.01)

(58) Field of Classification Search
  CPC .... H05K 9/00; H01Q 15/002; H01Q 15/0053; H01Q 17/00; H01Q 15/00; H01Q 15/004; H01Q 15/08
  USPC ........ 174/255, 250, 251, 253, 256–258, 260
  See application file for complete search history.

(56) References Cited

U.S. PATENT DOCUMENTS

| 4,090,204 A | 5/1978 | Farhat |
| 4,636,799 A | 1/1987 | Kubick |
| 4,706,094 A | 11/1987 | Kubick |
| 5,472,935 A | 12/1995 | Yandrofski et al. |
| 8,110,813 B2 | 2/2012 | Baars et al. |

(Continued)

FOREIGN PATENT DOCUMENTS

JP    2007-012710 A    1/2007

*Primary Examiner* — Tremesha S Willis  
(74) *Attorney, Agent, or Firm* — NSIP Law

(57) ABSTRACT

An apparatus includes active layers, and a first high resistive layer disposed between the active layers. The apparatus further includes second and third high resistive layers disposed on respective surfaces of the active layers, the second and third high resistive layers including first and second strip conductors, respectively, the first strip conductors being connected at an end by a first connecting conductor, the second strip conductors being connected at an end by a second connecting conductor, and the first connecting conductor being disposed perpendicularly to the second connecting conductor. The apparatus further includes first contact pads disposed on respective ends of the first connecting conductor, and second contact pads disposed on respective ends of the second connecting conductor. The apparatus further includes matching layers disposed on respective surfaces of the second and third high resistive layers.

16 Claims, 4 Drawing Sheets

(56) References Cited

U.S. PATENT DOCUMENTS

2011/0309716 A1 12/2011 Jenninger et al.
2012/0138343 A1* 6/2012 Beroz .................. H01L 21/486
                                                                  174/254

* cited by examiner

DEFLECTING DEVICE FOR ELECTROMAGNETIC RADIATION

CROSS-REFERENCE TO RELATED APPLICATIONS

This application claims the benefit under 35 USC 119(a) of Russian Patent Application No. 2012125442, filed on Jun. 20, 2012, in the Russian Federal Service for Intellectual Property, and Korean Patent Application No. 10-2013-0070185, filed on Jun. 19, 2013, in the Korean Intellectual Property Office, the entire disclosures of which are incorporated herein by reference for all purposes.

BACKGROUND

1. Field

The following description relates to a deflecting device for electromagnetic radiation.

2. Description of Related Art

Problems associated with a change of a vector of a wave propagation are often arising in systems using a directional electromagnetic radiation. Solutions may include systems based on a reorientation of a radiating antenna. However, a set of their mechanical elements cannot be miniaturized in a degree demanded by the development of modern microelectronics.

In a range of super high frequencies (SHF), a radiating antenna can have a small dimension, but a rotating (deflecting) device on a mechanical basis limits the possibility of reduction of an overall dimension of an SHF device with a changeable radiation pattern. To solve this problem a device providing a deflection of an electromagnetic wave passing through it, may be used. This device consists two active layers of a ferroelectric material, each of which has two parallel surfaces. A planar wave falls on one of the two parallel surfaces. A first active layer is disposed over a second active layer, and both of the first and second active layers have identical dimensions. A conducting plate of titanium oxide is disposed between the first and the second active layers and has mechanical contact to the first and second active layers without air gaps. The conducting plate functions as an electrode to ground. Electrodes of indium oxide, in the form of strip conductors, are spread on top and bottom surfaces of the multilayered structure, and are mutually perpendicular. A dielectric film is spread over the top and bottom electrodes to limit contact (matching) of the structure with an environment.

However, the radiating antenna and the deflection device that are described above have a number of drawbacks. They have a high value of thermal energy, emanating in high resistive layers when a control voltage is applied. Also, the above solutions suffer from a high level of SHF losses, and may need to use a minimum of two active layers for a 2-D scanning regime that leads to complexity in production and an increase of the SHF losses. Even further, the radiating antenna and the deflection device that are described above may need a difficult scheme of applying control voltages.

SUMMARY

In one general aspect, there is provided an apparatus including active layers, and a first high resistive layer disposed between the active layers. The apparatus further includes second and third high resistive layers disposed on respective surfaces of the active layers, the second and third high resistive layers including first and second strip conductors, respectively, the first strip conductors being connected at an end by a first connecting conductor, the second strip conductors being connected at an end by a second connecting conductor, and the first connecting conductor being disposed perpendicularly to the second connecting conductor. The apparatus further includes first contact pads disposed on respective ends of the first connecting conductor, and second contact pads disposed on respective ends of the second connecting conductor. The apparatus further includes matching layers disposed on respective surfaces of the second and third high resistive layers.

In another general aspect, there is provided a deflecting device including an active layer, and a first high resistive layer disposed on a surface of the active layer. The deflecting device further includes a second high resistive layer disposed on another surface of the active layer, and including strip conductors. The deflecting device further includes first contact pads disposed on respective ends of the strip conductors, and second contact pads disposed on respective opposite ends of the strip conductors. The deflecting device further includes matching layers disposed on respective surfaces of the first and second high resistive layers.

In still another general aspect, there is provided a deflecting device for electromagnetic radiation, including active layers, and a first high resistive layer disposed between the active layers. The deflecting device further includes second and third high resistive layers disposed on respective surfaces of the active layers, the second and third high resistive layers including first and second strip conductors, respectively, the first strip conductors being connected at an end by first resistors connected in series, the second strip conductors being connected at an end by second resistors connected in series, and the first strip conductors being disposed perpendicularly to the second strip conductors. The deflecting device further includes matching layers disposed on respective surfaces of the second and third high resistive layers.

Other features and aspects will be apparent from the following detailed description, the drawings, and the claims.

DETAIL DESCRIPTION

Figure 1:
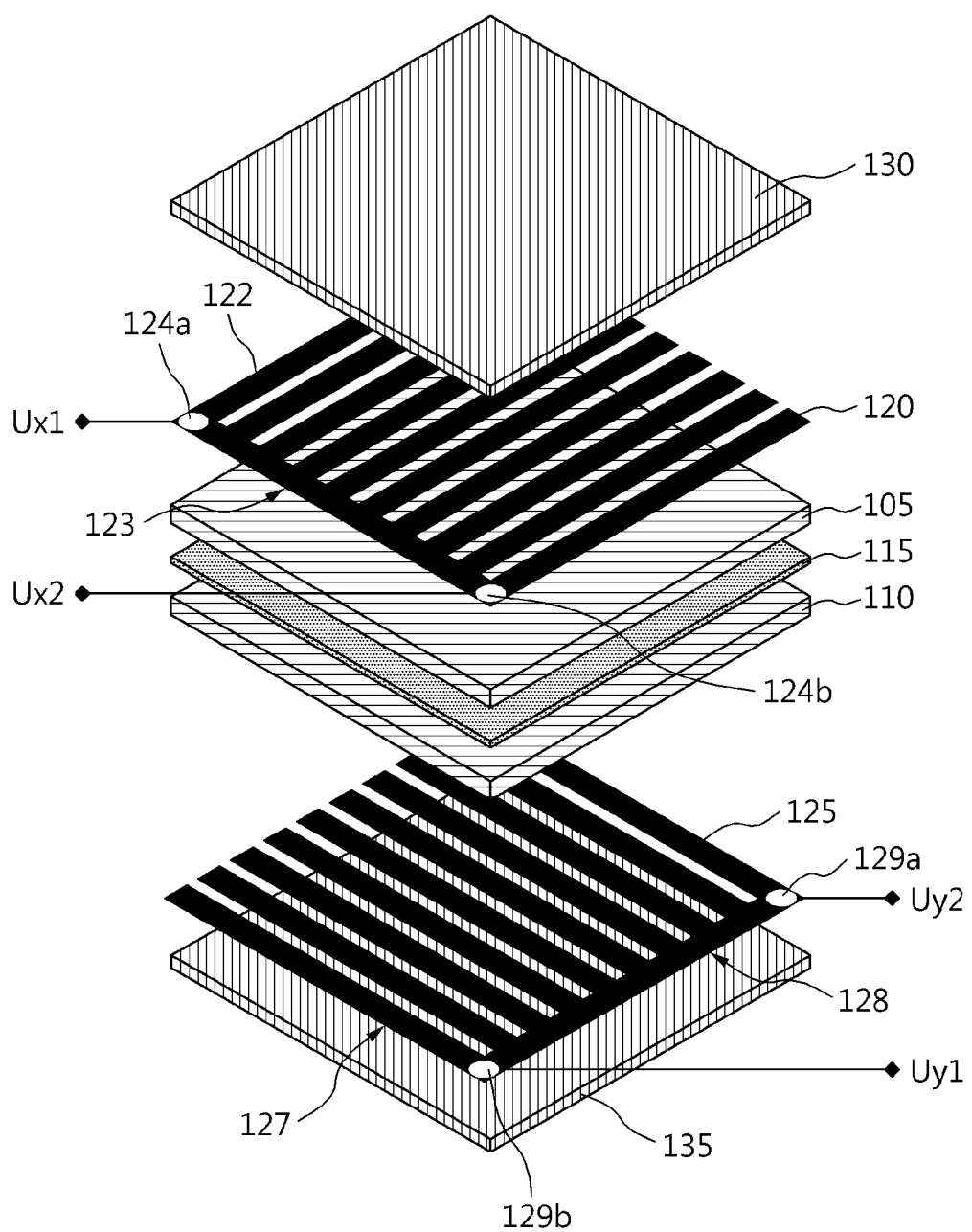
FIG. 1 is a perspective view illustrating an example of a deflecting device.

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Unless indicated otherwise, a statement that a first layer is "on" a second layer or a substrate is to be interpreted as covering both a case where the first layer is directly contacts the second layer or the substrate, and a case where one or more other layers are disposed between the first layer and the second layer or the substrate.

An example of a deflecting device described herein deflects directional electromagnetic radiation. The deflecting device includes two active layers of ferroelectric material and disposed between two high resistive layers. A third high resistive layer is disposed between the two active layers, and functions as an electrode. Two matching layers are disposed on the respective two high resistive layers. Voltage sources are connected to the two high resistive layers.

The example of the deflecting device described herein may decrease a level of thermal energy emanated by the two high resistive layers when a control voltage is applied to the two high resistive layers, and may decrease SHF losses. Also, the deflecting device may simplify production of the deflecting device, and may simplify a scheme of applying control voltages to the deflecting device.

FIG. 1 is a perspective view illustrating an example of a deflecting device. The deflecting device includes active layers 105 and 110 of ferroelectric material. The active layers 105 and 110 may be fabricated based on a ceramic technology. The active layers 105 and 110 are formed on both surfaces, respectively, of a high resistive layer 115 disposed between the active layers 105 and 110, and the high resistive layer 115 functions as an electrode.

High resistive layers 120 and 125 are formed on a top surface of the active layer 105 and a bottom surface of the active layer 110, respectively. Each of the high resistive layers 120 and 125 functions as an electrode, and includes a set of strip conductors galvanically connected at a side or end of a respective high resistive layer 120 or 125 (or active layer 105 or 110) by a respective strip conductor 122 or 127. The strip conductor 122 is perpendicular to the strip conductor 127. The high resistive layers 120 and 125 may be made of the same high resistive material as the high resistive layer 115. For example, the high resistive material may include ZnO, TiO2, TaN, and/or a solid solution of Si, Ti, and Ce.

The strip conductors 122 being connected at an end by a connecting conductor 123, the strip conductors 127 being connected at an end by a connecting conductor 128, and the connecting conductor 123 being disposed perpendicularly to the connecting conductor 128. Contact pads 124a and 124b disposed on respective ends of the connecting conductor 123, and contact pads 129a and 129b disposed on respective ends of the connecting conductor 128.

Metal contact pads 124a and 124b are formed on the strip conductor 122 of the high resistive layer 120, and metal contact pads 129a and 129b are formed on the strip conductor 127 of the high resistive layer 125. The contact pads 124a and 124b are spread out from each other (e.g., at respective opposite ends of the strip conductor 122), and the contact pads 129a and 129b are spread out from each other (e.g., at respective opposite ends of the strip conductor 127).

A voltage source Ux is connected to the deflecting device via the contact pads 124a and 124b, and applies a control voltage Ux1-Ux2 to the high resistive layer 120. A second voltage source Uy is connected to the deflecting device via the contact pads 129a and 129b, and applies a control voltage Uy1-Uy2 to the high resistive layer 125. Thus, a voltage distribution between the high resistive layers 115, 120, and 125 is set via an electric potential distribution along the strip conductors 122 and 127 between the contact pads 124a and 124b and 129a and 129b, respectively.

Matching layers 130 and 135 are formed a top surface of the high resistive layer 120 and a bottom surface of the high resistive layer 125, respectively. The matching layers 130 and 135 may be made of a linear dielectric material, and are used to match the deflecting device with an environment. The matching layers 130 and 135 may be fabricated based on a ceramic technology.

The deflecting device deflects a electromagnetic wave passing through the deflecting device. In more detail, a plane wave falls on a top surface of the matching layer 130, and leaves from a bottom surface of the matching layer 135. The deflecting device operates based on a variation of a phase incursion of an SHF signal passing through the deflecting device on various portions of the active layers 105 and 110 when the control voltages are applied. For a 2D scanning regime, the active layers 105 and 110 are needed, but for a 1D scanning regime, one of the active layers 105 and 110 is needed.

To use the deflecting device in an SHF range, the ferroelectric material in a paraelectric state may be used as a nonlinear material for the active layers 105 and 110. In this example, the phase incursion of the SHF signal passing through the active layers 105 and 110 may be changed by a variation of a dielectric permittivity that may be achieved an electric field application between the electrodes, namely, the high resistive layers 115, 120, and 125.

Since the SHF signal needs to penetrate the high resistive layers 115, 120, and 125, the high resistive layers 115, 120, and 125 are made of a high resistive material, transparent for the SHF signal. Accordingly, after deposition of the high resistive layers 120 and 125, a photolithography operation may be performed to form a topology of transparent (high resistive) electrodes in the high resistive layers 115, 120, and 125. In addition, a thickness of each of the high resistive layers 115, 120, and 125 may be less than a skin depth to avoid high losses in structure. Accordingly, the high resistive layers 115, 120, and 125 may be produced using a magnetron or sol-gel technology. Further, the high resistive layers 120 and 125 are not solid electrodes, but each of the high resistive layers 120 and 125 includes the set of the strip conductors, to decrease an amount of SHF losses.

The contact pads 124a and 124b are spread out from each other on the strip conductor 122 to apply the control voltages Ux1 and Ux2. This allows changing of the electric potential distribution on the high resistive layers 120 and 125 with using one voltage source, e.g., Ux. The contact pads 129a and 129b are spread out from each other on the strip conductor 127 to apply the control voltages Uy1 and Uy2. For effective deflecting of the electromagnetic wave, a gradient of the dielectric permittivity along the active layers 105 and 110 and perpendicular to a direction of a wave propagation may need to be formed. This may be done by applying the control voltages Ux1-Ux2 and Uy1-Uy2 to the high resistive layers 120 and 125 through the strip conductors 122 and 127, respectively. High levels of control signal energy scattering may be observed in the high resistive layers 120 and 125.

An effect of heating of an active material may be absent due to a relocation of a resistive divider on an edge of the strip conductor 122 or 127. In this example, a level of the SHF losses may be decreased by an application of the electrodes (e.g., the high resistive layers 120 and 125) in the form of the set of the strip conductors.

Figure 2:
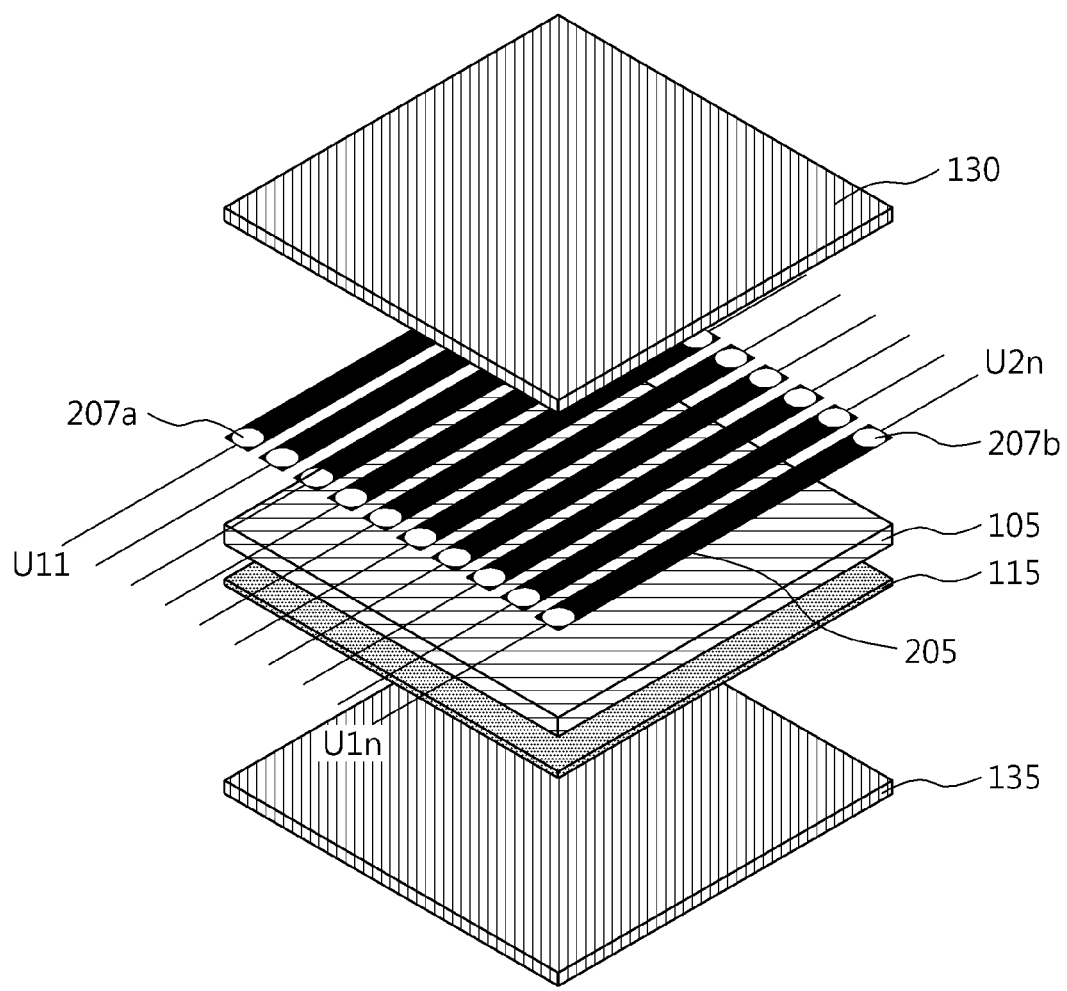
FIG. 2 is a perspective view illustrating an example of a deflecting device including a single active layer.

FIG. 2 is a perspective view illustrating an example of a deflecting device including the single active layer 105. However, the deflecting device is still able to deflect an SHF signal in two orthogonal planes (the 2D scanning regime), using only the single active layer 105. This may lead to a decrease of structure thickness, a decrease of SHF losses, and a simplification of a manufacture process. The deflecting device may deflect the SHF signal, using the single active layer 105, due to a modification of an application of a control voltage to the deflecting device, in comparison with the application of the control voltage to the deflecting device of FIG. 1.

In more detail, a high resistive layer 205 is formed on the top surface of the single active layer 105, and functions as an electrode used for the application of the control voltage to the deflecting device. The high resistive layer 205 includes a set of strip conductors. Metal contact pads 207a and 207b are formed on opposite ends of each of the strip conductors. The metal contact pads 207a and 207b may be formed based on a vacuum deposition technology using a topological mask.

Since the SHF signal needs to penetrate the high resistive layer 205, the high resistive layer 205 is made of a high resistive material, transparent for the SHF signal. In addition, a thickness of the high resistive layer 205 may be less than a skin depth to avoid the high losses in structure.

In contrast with the deflecting device of FIG. 1, namely, the high resistive layers 120 and 125, in FIG. 2, two different gradients of control voltages by electrical potential are applied to both sides of the high resistive layer 205. In more detail, a voltage source U1 is connected to the deflecting device via the contact pads 207a, and applies control voltage U11 through U1n to the high resistive layer 205. A second voltage source U2 is connected to the deflecting device via the contact pads 207b, and applies control voltages U21 through U2n to the high resistive layer 205. Such an application of the control voltages creates an uneven distribution of electrical potential on a surface of the single active layer 105 in two orthogonal directions that allows for the 2D scanning regime, using the single active layer 105.

Figure 3:
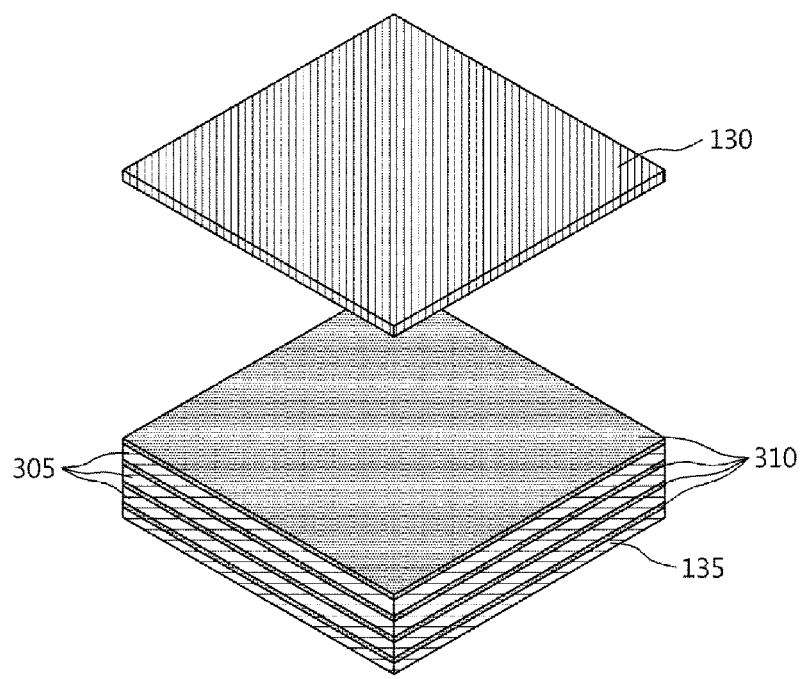
FIG. 3 is a perspective view illustrating an example of a multilayer structure.

FIG. 3 is a perspective view illustrating an example of a multilayer structure. Instead of the single active layer 105 and the high resistive layer 115 that are disposed on the matching layer 135, as shown in FIG. 2, referring to FIG. 3, a multilayer structure is formed, and the matching layer 135 is formed on a bottom surface of the multilayer structure. The multilayer structure includes a set of ferroelectric active layers 305 and a set of high resistive layers 310 between the ferroelectric active layers 305, respectively. Each of the high resistive layers 310 functions as an electrode. The deflecting device may reduce a level of emanated energy in an aperture plane when a control voltage is applied, SHF losses, and a value of the control voltage.

Figure 4:
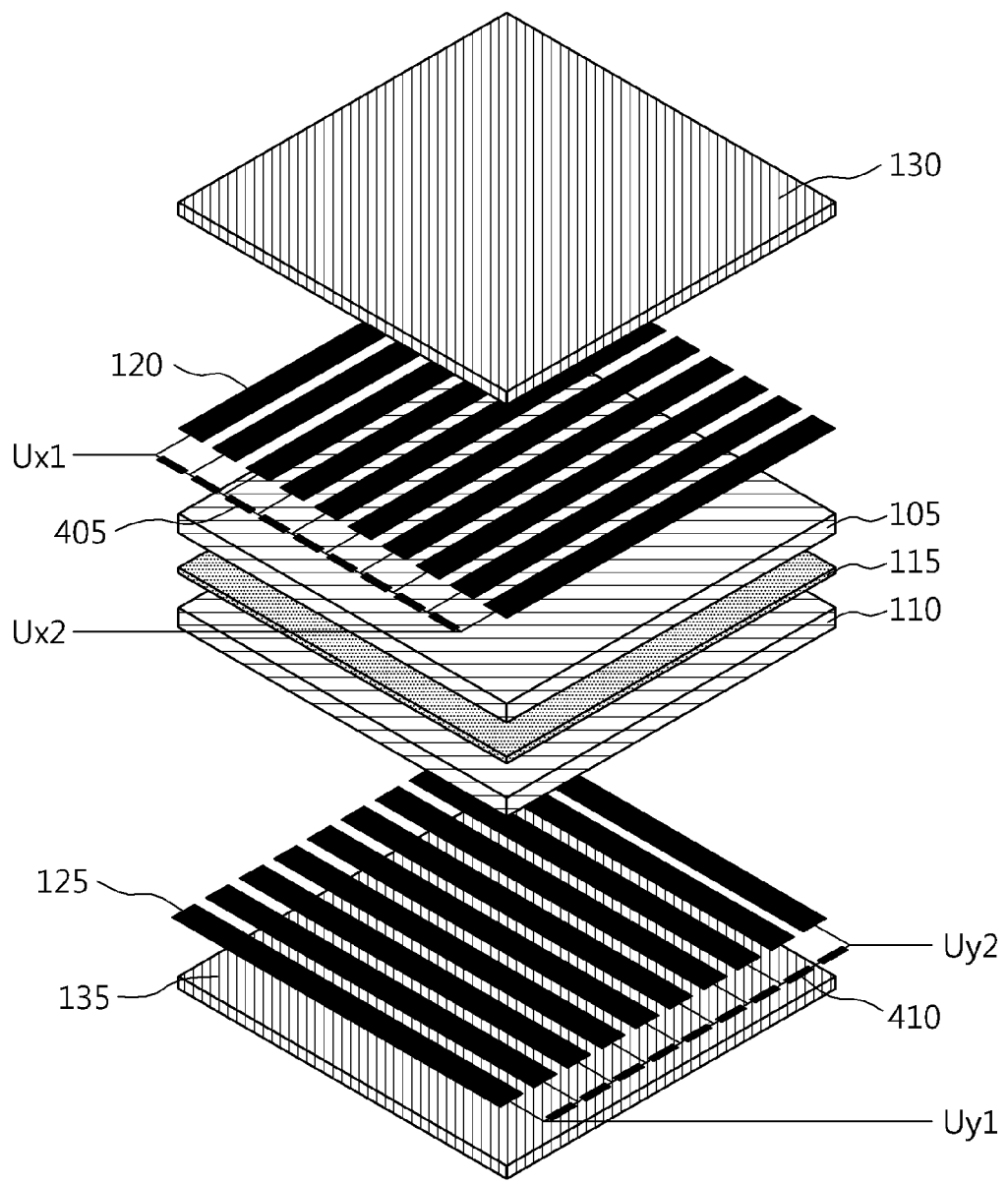
FIG. 4 is a perspective view illustrating an example of a deflecting device including resistors.

FIG. 4 is a perspective view illustrating an example of a deflecting device including resistors 405 and 410. The deflecting device of FIG. 4 includes the active layers 105 and 110, the high resistive layers 115, 120, and 125, the matching layers 130 and 135, and the voltage sources Ux and Uy, of FIG. 1, so accordingly, description of these components is made with reference to FIG. 1. In contrast to FIG. 1, in FIG. 4, the set of the strip conductors of the high resistive layer 120 is shorted by a set of the serially-connected resistors 405, and the set of the strip conductors of the high resistive layer 125 is shorted by a set of the serially-connected resistors 410. Each of the resistors 405 and 410 is located outside edges of the active layers 105 and 110, where the strip conductors of the high resistive layer 120 are disposed perpendicularly to the strip conductors of the high resistive layer 125.

The voltage source Ux applies the control voltage Ux1-Ux2 to opposite ends of a chain of the resistors 405 connected to the high resistive layer 120. The second voltage source Uy applies the control voltage Uy1-Uy2 to opposite ends of a chain of the resistors 410 connected to the high resistive layer 125. In the deflecting device, an effect of heating of an active material is absent due to the location of resistive elements outside the strip conductors forming the high resistive layers 120 and 125, respectively.

The examples of the deflecting device described above may be applied in a wide range of fields, such as, for example, telecommunications and radar systems.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus comprising:
   active layers;
   a first high resistive layer disposed between the active layers;
   second and third high resistive layers disposed on respective surfaces of the active layers, the second and third high resistive layers comprising first and second strip conductors, respectively, the first strip conductors being connected at an end by a first connecting conductor, the second strip conductors being connected at an end by a second connecting conductor, and the first connecting conductor being disposed perpendicularly to the second connecting conductor;
   first contact pads disposed on respective ends of the first connecting conductor;
   second contact pads disposed on respective ends of the second connecting conductor; and
   matching layers disposed on respective surfaces of the second and third high resistive layers.

2. The apparatus of claim 1, wherein the active layers comprise a ferroelectric material.

3. The apparatus of claim 1, wherein the first, second, and third high resistive layers comprise a high resistive material.

4. The apparatus of claim 1, further comprising:
   a first voltage source connected to the first contact pads, and configured to apply a first voltage to the first contact pads; and
   a second voltage source connected to the second contact pads, and configured to apply a second voltage to the second contact pads.

5. The apparatus of claim 1, wherein the matching layers comprise a linear dielectric material.

6. The apparatus of claim 1, wherein a thickness of each of the first, second, and third high resistive layers is less than a skin depth.

7. The apparatus of claim 1, wherein the first, second, and third high resistive layers comprise ZnO, or TiO2, or TaN, or any combination thereof.

8. The apparatus of claim 1, wherein the first, second, and third high resistive layers comprise a solid solution of Si, Ti, and Ce.

9. The apparatus of claim 1, wherein the first, second, and third high resistive layers are transparent.

10. A deflecting device comprising:
an active layer;
a first high resistive layer disposed on a surface of the active layer;
a second high resistive layer disposed on another surface of the active layer, wherein the second high resistive layer comprises strip conductors and is formed of a high resistive material transparent to a super high frequency (SHF) signal, and the active layer is made of a ferroelectric material;
first contact pads disposed on respective ends of the strip conductors;
second contact pads disposed on respective opposite ends of the strip conductors; and
matching layers disposed on respective surfaces of the first and second high resistive layers.

11. The deflecting device of claim 10, further comprising:
first voltage sources connected to the respective first contact pads, and configured to apply first voltages to the respective first contact pads; and
second voltage sources connected to the respective second contact pads, and configured to apply second voltages to the respective second contact pads.

12. The deflecting device of claim 10, further comprising:
a multilayer structure comprising active layers and high resistive layers between the active layers,
wherein one of the matching layers is disposed on a surface of the multilayer structure.

13. A deflecting device for electromagnetic radiation, comprising:
active layers;
a first high resistive layer disposed between the active layers;
second and third high resistive layers disposed on respective surfaces of the active layers, the second and third high resistive layers comprising first and second strip conductors, respectively, the first strip conductors being connected at an end by first resistors connected in series, the second strip conductors being connected at an end by second resistors connected in series, and the first strip conductors being disposed perpendicularly to the second strip conductors; and
matching layers disposed on respective surfaces of the second and third high resistive layers.

14. The deflecting device of claim 13, wherein the active layers comprise a ferroelectric material.

15. The deflecting device of claim 13, wherein the first and second resistors are disposed outside edges of the active layers.

16. The deflecting device of claim 13, further comprising:
a first voltage source connected to ends of the first resistors, and configured to apply a first voltage to the ends of the first resistors; and
a second voltage source connected to ends of the second resistors, and configured to apply a second voltage to the ends of the second resistors.

* * * * *